United States Patent
Kashiwakura

(10) Patent No.: US 8,982,576 B2
(45) Date of Patent: Mar. 17, 2015

(54) PRINTED WIRING BOARD, AND METHOD OF SUPPLYING POWER AND FORMING WIRING FOR PRINTED WIRING BOARD

(75) Inventor: Kazuhiro Kashiwakura, Minato-Ku (JP)

(73) Assignee: NEC Corporation, Tokyo (JP)

( * ) Notice: Subject to any disclaimer, the term of this patent is extended or adjusted under 35 U.S.C. 154(b) by 8 days.

(21) Appl. No.: 13/821,895

(22) PCT Filed: Aug. 30, 2011

(86) PCT No.: PCT/JP2011/070096
§ 371 (c)(1),
(2), (4) Date: Mar. 8, 2013

(87) PCT Pub. No.: WO2012/039269
PCT Pub. Date: Mar. 29, 2012

(65) Prior Publication Data
US 2013/0170155 A1 Jul. 4, 2013

(30) Foreign Application Priority Data
Sep. 21, 2010 (JP) ................................. 2010-210462

(51) Int. Cl.
*H05K 1/00* (2006.01)
*H05K 1/18* (2006.01)
*H05K 1/02* (2006.01)

(52) U.S. Cl.
CPC ................ *H05K 1/18* (2013.01); *H05K 1/0265* (2013.01); *H05K 2201/0784* (2013.01); *H05K 2201/0969* (2013.01); *H05K 2201/0979* (2013.01)
USPC ............ 361/777; 361/748; 174/260; 174/261

(58) Field of Classification Search
USPC .......... 174/250, 253, 257, 260, 261; 361/748, 361/777, 780, 794, 803, 760
See application file for complete search history.

(56) References Cited

U.S. PATENT DOCUMENTS

2007/0144770 A1* 6/2007 Nakao ............................ 174/260
2008/0257592 A1* 10/2008 Harrer et al. .................. 174/255

FOREIGN PATENT DOCUMENTS

| JP | 20-270862 A | 10/1998 |
|---|---|---|
| JP | 2001-85805 A | 3/2001 |
| JP | 2005-183790 A | 7/2005 |

OTHER PUBLICATIONS

Texas Instruments, PCB Design Guidelines for Reduced EMI, Nov. 1999, Document SZZA009, p. 7.*

* cited by examiner

*Primary Examiner* — Angel R Estrada
*Assistant Examiner* — Dimary Lopez Cruz
(74) *Attorney, Agent, or Firm* — Foley & Lardner LLP

(57) ABSTRACT

Provided is a printed wiring board including a power source, a plurality of LSIs, and a planar power supply wiring for supplying power from the power source to the LSIs. A plurality of partial wiring patterns each forming a current path from the power source to the LSIs are provided by forming gaps in the power supply wiring.

7 Claims, 7 Drawing Sheets

US 8,982,576 B2

PRINTED WIRING BOARD, AND METHOD OF SUPPLYING POWER AND FORMING WIRING FOR PRINTED WIRING BOARD

TECHNICAL FIELD

This invention relates to a printed wiring board and a method of supplying power and forming wiring for the printed wiring board.

BACKGROUND ART

The increasing sophistication (higher-speed operation, higher density) of LSIs accelerates the lowering of a power supply voltage, thus making it more difficult to suppress a voltage drop in feed wiring on a printed board.

For example, VLSIs whose power supply voltage is 1 V and power consumption is 40 to 50 W have been put into the market in recent years. In this case, a power supply current is 40 to 50 A. Supposing that the application range of 1 V is ±5%, a permissible voltage drop is 50 mV or less. At present, however, it is difficult to establish a design method for realizing this goal.

Examples of the related art of feed wiring are Japanese Unexamined Patent Application Publication (JP-A) Nos. Hei 10-270862 and 2005-183790. Both the technologies are aimed at suppressing electromagnetic interference (EMI) by inserting a slit in the vicinity of an LSI to separate a high frequency component. In the technologies, however, feed wiring from an on-board power source to the LSI is not considered, and hence there is a problem in that it is ineffective in suppressing a DC voltage drop.

DISCLOSURE OF THE INVENTION

Problem to be Solved by the Invention

It is an object of this invention to provide a technology for solving the above-mentioned problem inherent to the conventional technologies, and to provide a printed wiring board and a method of forming feed wiring in a printed wiring board, which are capable of reducing a DC voltage drop at the time of power feeding.

Means to Solve the Problem

According to this invention, there is provided a printed wiring board, comprising:
a power source;
at least one LSI;
a planar power supply wiring for supplying power from the power source to the LSI;
gaps formed in the planar power supply wiring; and
a plurality of partial wiring patterns each forming a current path from the power source to the LSI, the partial wiring patterns being formed via the gaps formed in the planar power supply wiring.

Further, according to this invention, there is provided a method of supplying power and forming wiring for a printed wiring hoard, the printed wiring hoard including a power source, at least one LSI, and a planar power supply wiring for supplying the power from the power source to the LSI,
the method comprising:
forming gaps in the planar power supply wiring; and
forming a plurality of partial wiring patterns each forming a current path from the power source to the at least one LSI.

Effect of the Invention

According to this invention, the DC voltage drop at the time of power feeding from the power source of the printed wiring board to the LSI can be reduced.

BEST MODE FOR EMBODYING THE INVENTION (Configuration in the Related Art)

At first, the related art is described with reference to FIG. 1 for more clarifying the features of this invention.

Figure 1:
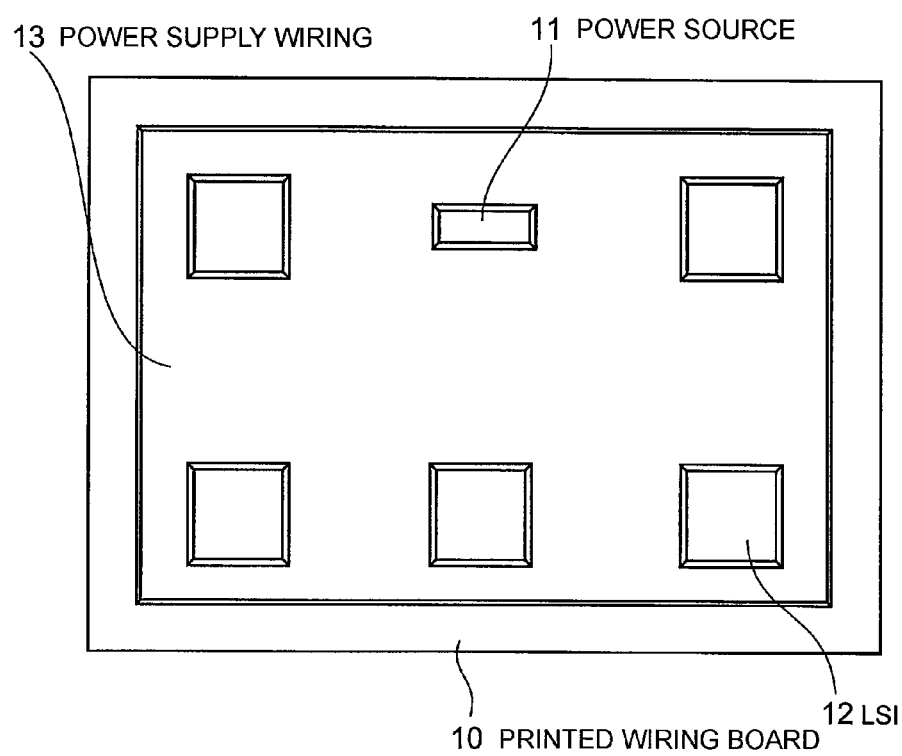
FIG. 1 is a diagram illustrating a configuration of a printed wiring board in the related art.

FIG. 1 illustrates a typical design method for feeding power from a power source to a plurality of LSIs.

As illustrated in FIG. 1, a printed wiring board 10 includes a power source 11, a plurality of LSIs 12, and power supply wiring 13 for feeding power from the power source 11 to the LSIs 12.

In recent years, semiconductor devices such as LSIs have become lower in voltage and higher in density for high-speed operation. In recent years, the power supply voltage has reduced from 5 V or 3.3 V to 1.0 V or 0.9 V. On the contrary, the processing ability of LSIs has improved to lead to the growth of the scale of LSIs, and the power supply current is now increasing. In addition, the range of a power supply voltage to be fed to the LSI is expressed as a percentage of the power supply voltage, and is typically about +5%. This value does not change even at a low voltage.

In other words, a permissible voltage drop in feed line is within 250 mV at a power supply voltage of 5 V and within 50 mV at a power supply voltage of 1 V, that is, the absolute value of the permissible range has significantly reduced, thereby increasing the difficulty in design.

Under such circumstances, in the configuration of the printed wiring board 10 illustrated in FIG. 1, the power supply wiring 13 has no feed wiring from the power source 11 to the LSI 12, and hence a current path from the power source 11 toward the LSI 12 cannot be controlled. As a result, it is difficult to reduce a DC voltage drop at the time of power feeding.

This invention solves the above-mentioned problem in the related art.

Specifically, this invention has the features that, in power supply wiring (planar wiring) for feeding power from a power source (on-board power source, DC-DC converter, regulator, etc.) to an LSI in an electronic circuit board, a gap is inserted for every LSI, every power supply terminal of the LSI, or every terminal block so as to separate the planar wiring, to thereby improve the resistance characteristics inherent to the planar wiring so as to feed power to the LSI efficiently.

Next, embodiments of this invention are described in detail with reference to the drawings.

(First Embodiment)

Figure 2:
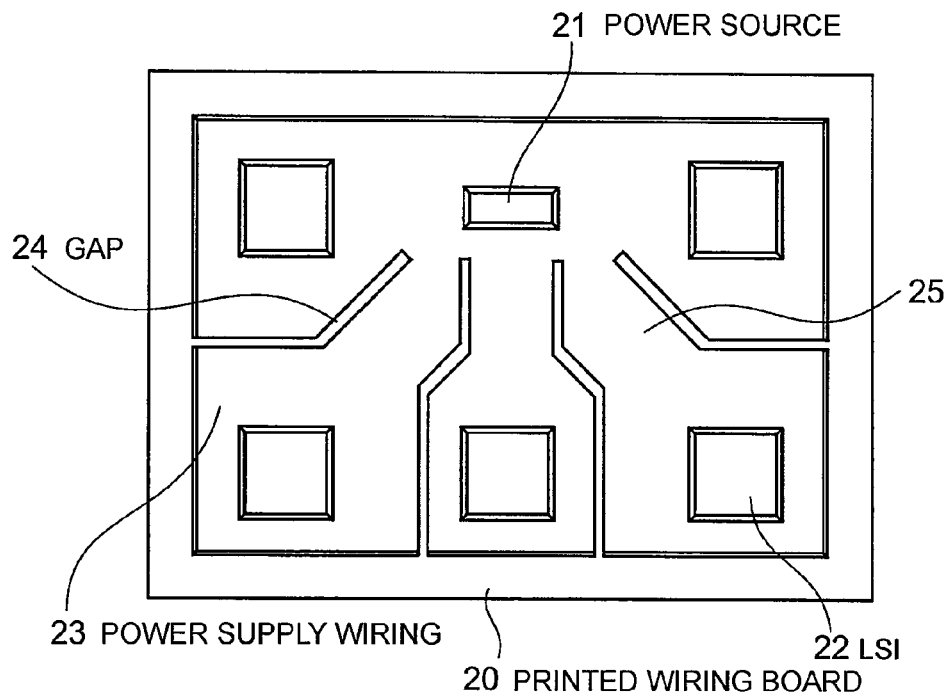
FIG. 2 is a diagram illustrating a configuration of a printed wiring board according to a first embodiment of this invention.

Referring to FIG. 2, a configuration of a printed wiring board according to a first embodiment of this invention is described.

As illustrated in FIG. 2, a printed wiring board 20 includes a power source 21, a plurality of LSIs 22, and power supply wiring 23 for feeding power from the power source 21 to the LSIs 22. In the first embodiment of this invention, a plurality of gaps 24 are formed in the power supply wiring 23. This point is greatly different from the printed wiring board 10 in the related art illustrated in FIG. 1.

In the first embodiment of this invention, the gaps 24 are formed in the power supply wiring 23, to thereby provide a plurality of partial wiring patterns 25 each forming a current path from the power source 21 toward the LSI 22.

Specifically, in the case of power feeding from a single power source 21 to the plurality of LSIs 22, the gaps 24 are formed among the LSIs 22 to employ the star wiring structure as viewed from the power source 21.

Figure 3:
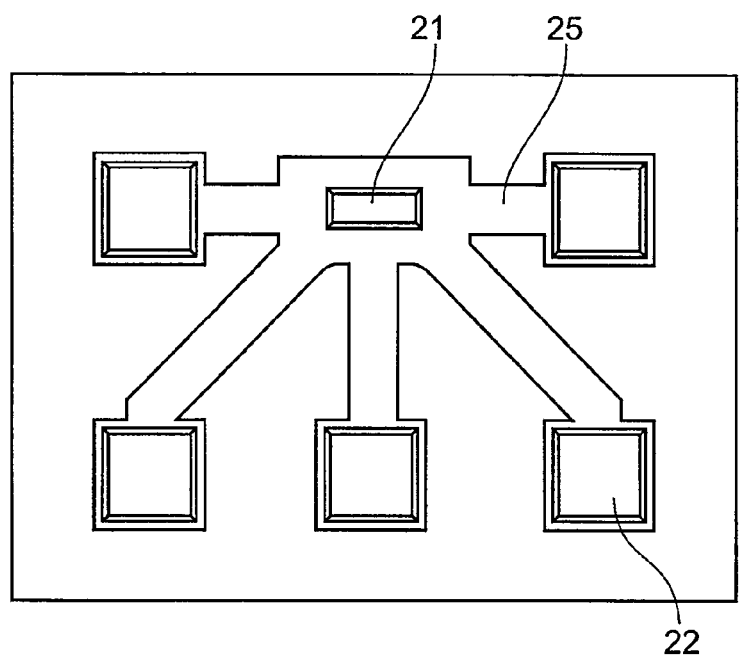
FIG. 3 is a diagram illustrating the configuration of the printed wiring board, emphasizing the star profile by widening gaps.

Now, FIG. 3 illustrates the configuration of the printed wiring board 20, emphasizing the star profile by widening the gaps 24.

As illustrated in FIG. 3, only one power source 21 is present, and the partial wiring patterns 25 form a star wiring pattern whose center is the power source 21. Such star wiring whose center is the power source 21 can effectively reduce a DC voltage drop at the time of power feeding.

In this case, the power source 21 is, for example, an on-board power source, a DC-DC converter, a regulator, or the like.

Next, referring to FIGS. 4 to 8, the operation and principle in the first embodiment of this invention are described.

Figure 4:
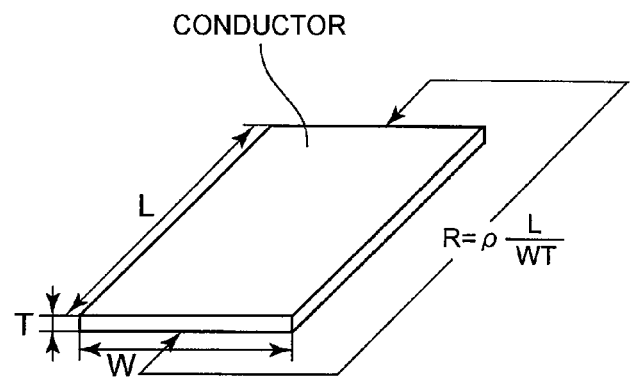
FIG. 4 is a diagram illustrating the operation and principle in the first embodiment of this invention.
Figure 5:
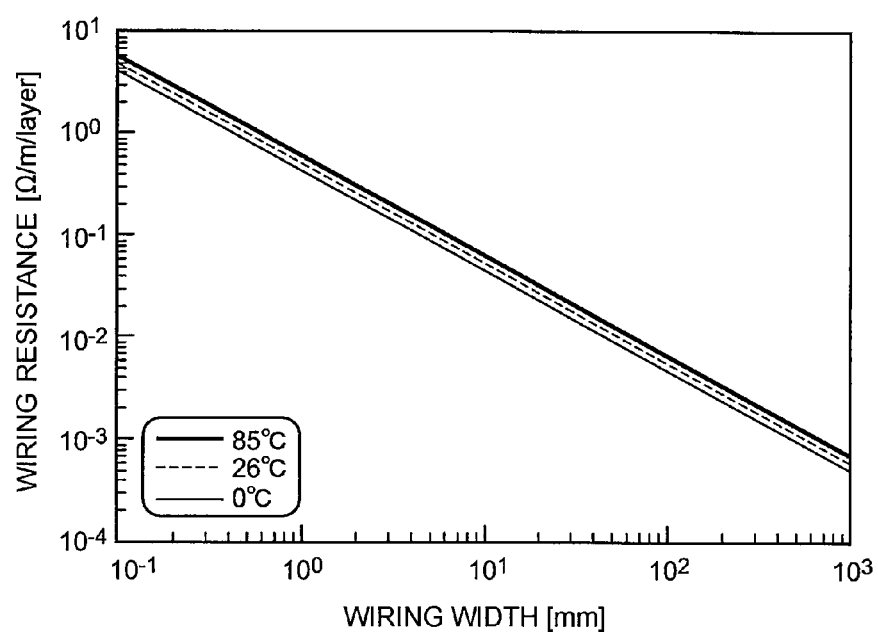
FIG. 5 is a graph showing the relationship of wiring resistance (conductor resistance) with respect to the wiring width in the case of using copper as a conductor material.

In general, it is said that "widening a power supply plane" as illustrated in FIG. 1 is required in design of power supply wiring. This is because a conductor resistance R becomes smaller as the wiring width becomes larger as illustrated in FIG. 4, the conductor resistance R being expressed as follows:

$$R = \rho \times L / (W \times T) \quad (1)$$

where W represents the conductor width, T represents the conductor thickness, L represents the conductor length, and $\rho$ represents the resistivity. As an example, FIG. 5 shows the relationship of wiring resistance (conductor resistance) with respect to the wiring width in the case of using copper as a conductor material.

However, Expression (1) is satisfied when a uniform current flows through the conductor cross-section. The relationship is not satisfied in the case of power feeding in an electronic circuit (printed wiring board 10) as illustrated in FIG. 1.

The reason is described with reference to FIGS. 6 and 7.

Figure 6:
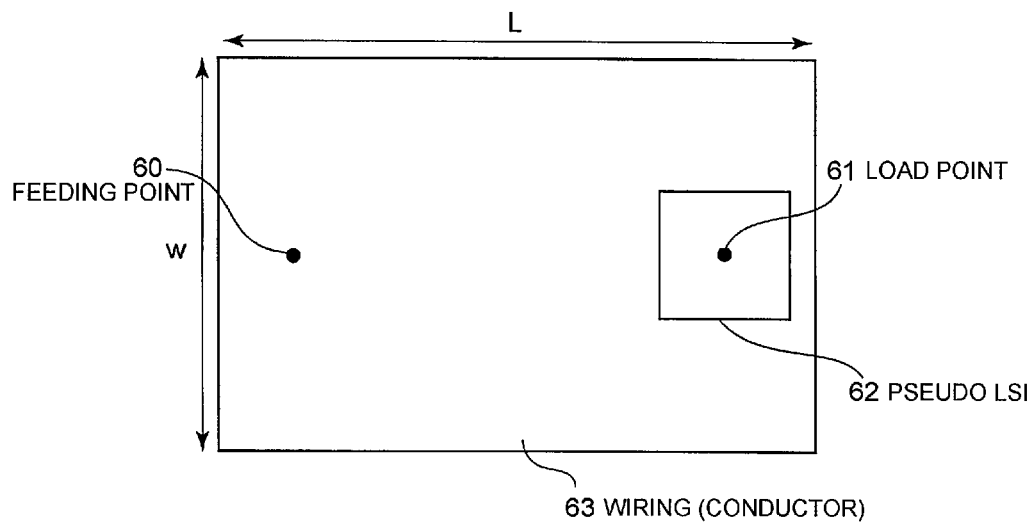
FIG. 6 is a diagram illustrating a voltage distribution under the application of a desired potential difference between a feeding point and a load point.

FIG. 6 illustrates a voltage distribution under the application of a desired potential difference between a feeding point 60 and a load point 61. In FIG. 6, reference numeral 62 represents a pseudo LSI, and reference numeral 63 represents wiring (conductor).

Figure 7:
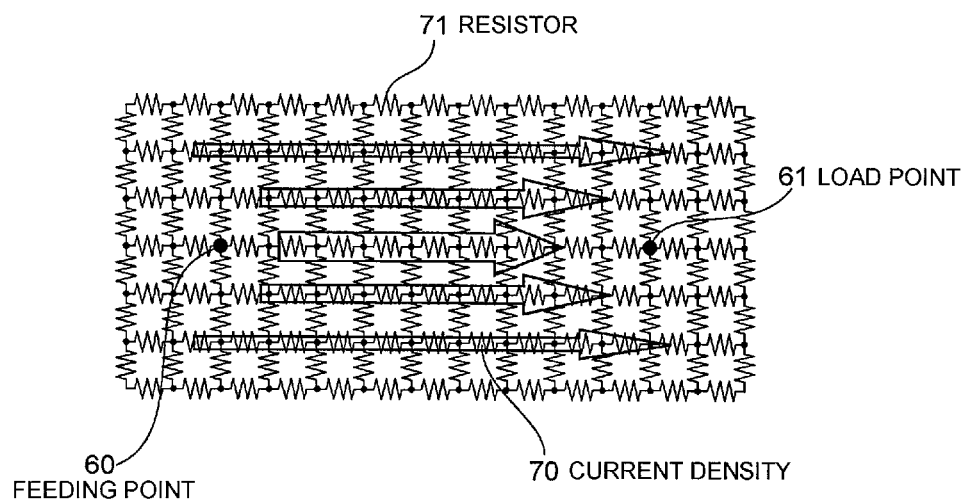
FIG. 7 is an equivalent circuit of FIG. 6.

FIG. 7 is an equivalent circuit of FIG. 6.

A current flowing between the feeding point 60 and the load point 61 first flows through the shortest route (that is, the straight line connecting the two points). When the current flows only through the shortest route, a voltage drop occurs with respect to its vicinity, and hence a current starts to flow in a path slightly outside the shortest route so as to compensate for the voltage drop.

Similarly, another current flows in order to compensate for a potential difference with respect to the outside of the path. As a whole, a current density 70 (see the arrows of FIG. 7) becomes higher as the distance of the current path becomes shorter, and the current density 70 becomes lower as the current path is present more peripherally.

This phenomenon occurs instantly after input of power supply. Although the current distribution cannot be observed actually, the current distribution can be calculated from the equivalent circuit of FIG. 7. In FIG. 7, reference numeral 71 represents a resistor.

Figure 8:
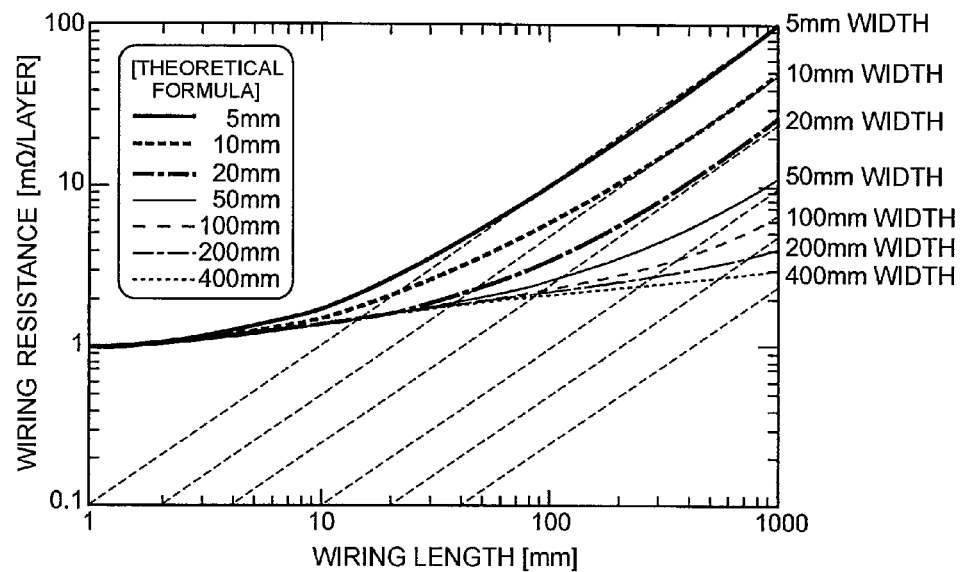
FIG. 8 is a graph showing the relationship of the wiring resistance with respect to the wiring length.

Based on the phenomenon, FIG. 8 plots the conductor resistance (wiring resistance) with respect to the wiring length, with the wiring width as a parameter.

It can be found from FIG. 8 that, when a given wiring length is small, the conductor resistance cannot be reduced even by increasing the wiring width. For example, consider the case where the wiring length is 100 mm. It should read that the wiring resistance is 2.5 m$\Omega$ when the wiring width is 50 mm, and the wiring resistance is 2.1 m$\Omega$ when the wiring width is 100 mm.

If following Expression (1), the wiring resistance is supposed to be ½ times when the wiring width is doubled, but it is not true. This is because, as described above, Expression (1) is the relational expression which is satisfied when the current densities are distributed in the cross-section uniformly.

According to the first embodiment of this invention, the feed regions can be separated for each LSI 22 so that the current densities may be uniform, and hence the DC voltage drop can be suppressed. In particular, by forming the star wiring whose center is the power source 21 (see FIG. 3), the DC voltage drop at the time of power feeding can be reduced effectively.

(Second Embodiment)

Figure 9:
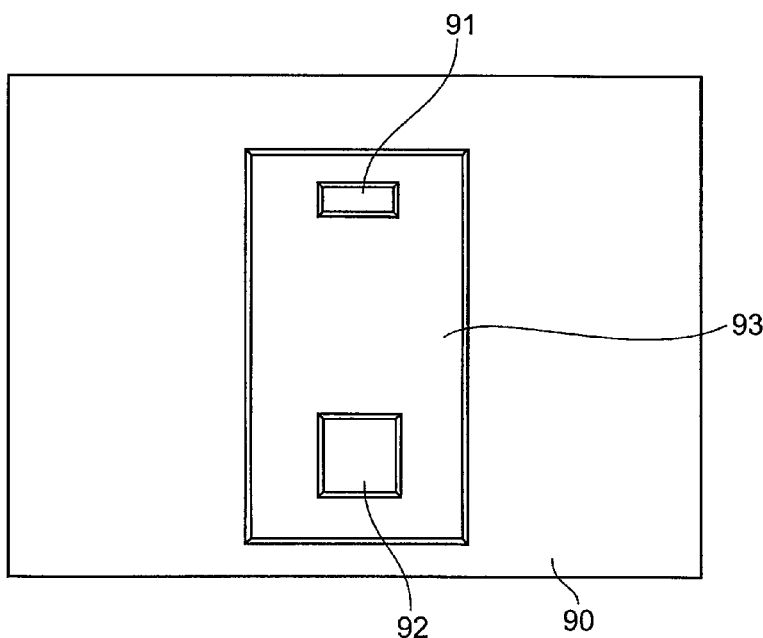
FIG. 9 is a diagram illustrating a configuration of a printed wiring board in the related art for easy understanding of a second embodiment of this invention.

Next, referring to FIGS. 9 to 12, a configuration of a printed wiring board according to a second embodiment of this invention is described. Note that, FIG. 9 is a diagram illustrating a configuration of a printed wiring board in the related art for easy understanding of the second embodiment of this invention.

As illustrated in FIG. 9, a printed wiring board 90 includes a power source 91, an LSI 92, and power supply wiring 93 for feeding power from the power source 91 to the LSI 92. In this manner, a single power source 91 supplies a current to a single LSI 92.

This configuration increases power consumption of the LSI 92, resulting in the problem of a voltage drop similarly to the above. Specifically, in the configuration of the printed wiring board 90 illustrated in FIG. 9, the power supply wiring 93 has no feed wiring from the power source 91 toward the LSI 92, and hence a current path from the power source 91 toward the LSI 92 cannot be controlled. As a result, it is difficult to reduce a DC voltage drop at the time of power feeding. In other words, as shown in FIG. 8, if the wiring width is increased too much, the uniformity of current density cannot be maintained, resulting in an increased voltage drop.

The second embodiment of this invention solves the problem in the related art.

Figure 10:
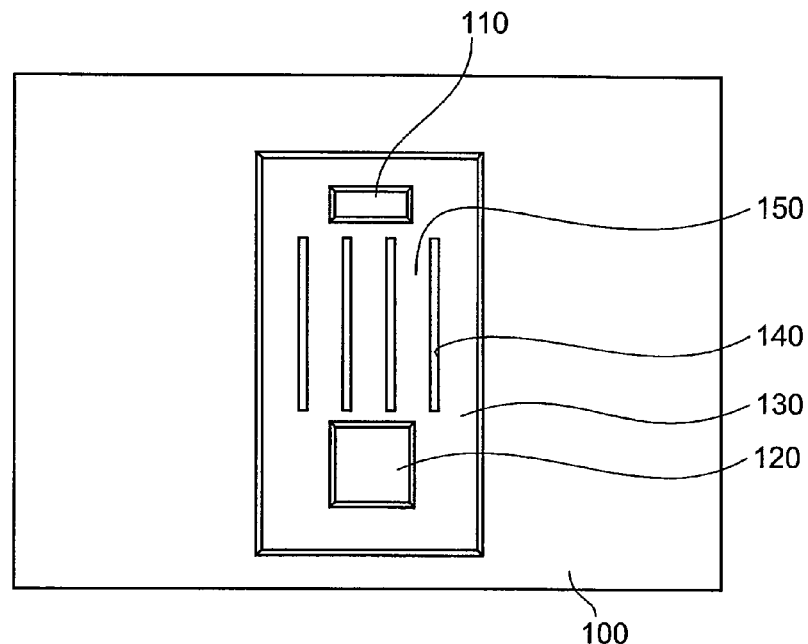
FIG. 10 is a diagram illustrating a configuration of a printed wiring board according to the second embodiment of this invention.
Figure 11:
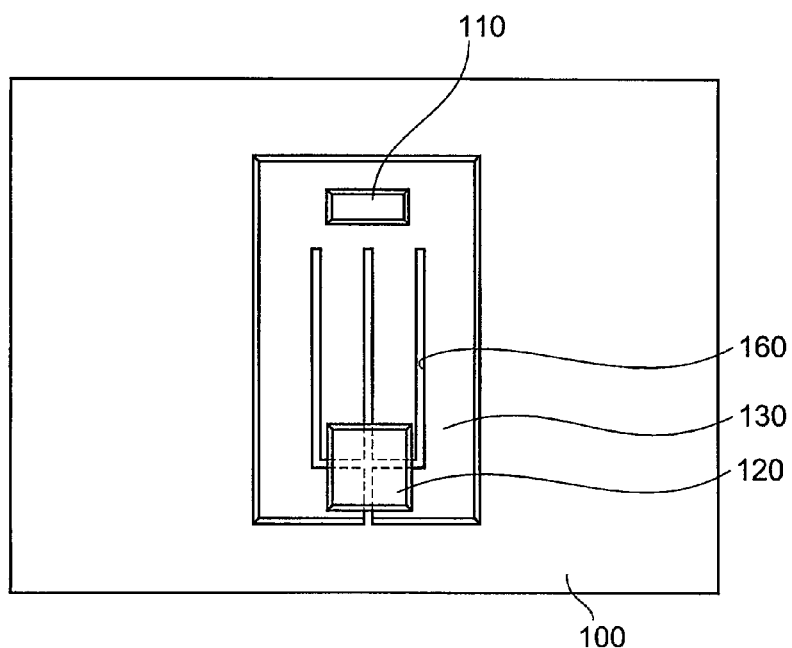
FIG. 11 is a diagram illustrating a modified example of the printed wiring board illustrated in FIG. 10.
Figure 12:
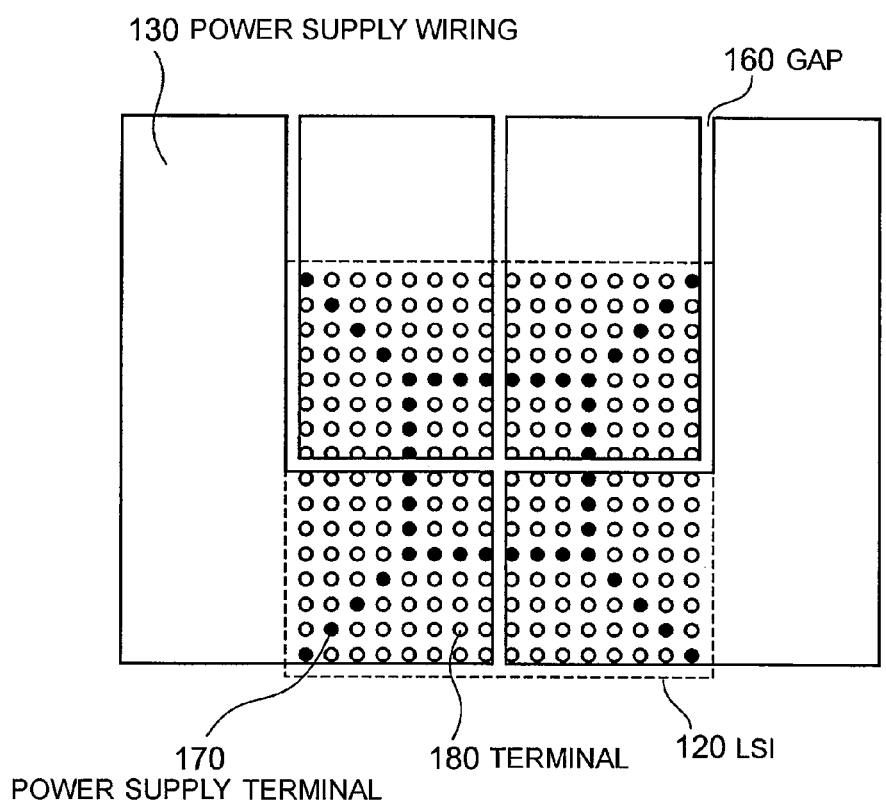
FIG. 12 is an enlarged diagram of an LSI portion of FIG. 11.

Referring to FIGS. 10 to 12, the configuration of the printed wiring board according to the second embodiment of this invention is described.

As illustrated in FIG. 10, a printed wiring board 100 includes a power source 110, an LSI 120, and power supply wiring 130 for feeding power from the power source 110 to the LSI 120. In the second embodiment of this invention, a plurality of gaps 140 are formed in the power supply wiring 130. In this manner, only one pair of the power source 110 and the LSI 120 is provided so that the power source 110 and the LSI 120 may be opposed to each other, and the plurality of gaps 140 are formed into a linear shape between the pair of the power source 110 and the LSI 120, to thereby form reed-shaped partial wiring patterns 150. This point is greatly different from the printed wiring board 90 in the related art illustrated in FIG. 9.

In the second embodiment of this invention, the plurality of gaps 140 in a linear shape are formed in the power supply wiring 130, to thereby provide the reed-shaped partial wiring patterns 150 each forming a current path from the power source 110 toward the LSI 120.

As described above, in the case of power feeding from a single power source 110 to a single LSI 120, the reed-shaped partial wiring patterns 150 are formed between the power source 110 and the LSI 120 in order to obtain proper feed wiring. The plurality of reed-shaped feed wirings can obtain a uniform current density of the individual reed-shaped partial wiring patterns 150, with the result that the voltage drop is suppressed.

In this case, the power source 120 is, for example, an on-board power source, a DC-DC converter, a regulator, or the like.

FIG. 11 is a diagram illustrating a modified example (improved example) of the printed wiring board 100 illustrated in FIG. 10.

A printed wiring board 100 illustrated in FIG. 11 is different from the printed wiring board 100 illustrated in FIG. 11 in that a gap 160 separates also power supply terminals 170 (see FIG. 12) of the LSI 120.

FIG. 12 is an enlarged diagram of the LSI 120 of FIG. 11, illustrating an example of separating the power supply terminals 170 of the LSI 120. In FIG. 12, reference numeral 180 represents terminals of the LSI 120.

FIG. 12 assumes that the power supply terminals 170 are all the same power source. Inside the LSI 120, all the power sources are connected in common. It is therefore unnecessary to connect the power supply terminals in common on the printed wiring board 100.

With this configuration, the current can be distributed efficiently to the power supply wiring 130 separated into the reed shape (reed-shaped partial wiring patterns 150).

The embodiments of this invention have been described in detail above, but this invention is not limited to the above-mentioned embodiments, and various modifications can be made thereto based on the technical gist of this invention.

This application is based on Japanese Patent Application No. 2010-210462 filed on Sep. 21, 2010, and hence contents disclosed in the above-mentioned patent application are all incorporated in this application.

The invention claimed is:

1. A printed wiring hoard, comprising:
   a power source;
   at least one LSI;
   a planar power supply wiring for supplying power from the power source to the LSI, the planar power supply wiring having a non-uniform current density as a whole;
   gaps formed in the planar power supply wiring; and
   a plurality of partial wiring patterns each forming a current path from the power source to the LSI, the partial wiring patterns being formed via the gaps formed in the planar power supply wiring,
   wherein the non-uniform current density of the planar power supply wiring occurs instantly after input of power supply for the power source to generate a DC voltage drop,
   wherein the gaps are formed so that each of the partial wiring patterns has a uniform current density to reduce the DC voltage drop.

2. A printed wiring, board according to claim 1, wherein;
   the at least one LSI comprises a plurality of LSIs;
   the gap is formed between a pair of adjacent LSIs of the plurality of LSIs; and
   each of the partial wiring patterns is provided for each of the LSI.

3. A printed wiring board according to claim 2, wherein:
   the power source comprises only one power source; and
   the partial wiring patterns fiirrn a star wiring pattern whose center is the power source.

4. A printed wiring hoard according to claim 1, wherein:
   only one pair of the power source and the LSI Is provided so that the power source and the LSI are opposed to each other; and
   the gaps are formed into a linear shape between the pair of the power source and the LSI.

5. A printed wiring heard according to claim 4, wherein the partial wiring patterns form reed-shaped wiring patterns.

6. A printed wiring board according to claim 4, wherein:
   the LSI comprises a plurality of power supply terminals; and
   the gaps are formed so as to separate the power supply terminals from one another.

7. A printed wiring hoard according, to claim 1, wherein the power source comprises anyone of an on-board power source, a DC-DC converter, and a regulator.

* * * * *